(12) United States Patent
Schuh et al.

(10) Patent No.: US 10,876,021 B2
(45) Date of Patent: *Dec. 29, 2020

(54) ADHESIVE HAVING WATER VAPOUR BARRIER PROPERTIES COMPRISING INCIPIENTLY POLYMERIZED EPOXY SYRUP

(71) Applicant: TESA SE, Norderstedt (DE)

(72) Inventors: Christian Schuh, Hamburg (DE); Klaus Keite-Telgenbüscher, Hamburg (DE); Annalena Graucob, Rosengarten (DE)

(73) Assignee: TESA SE, Norderstedt (DE)

( * ) Notice: Subject to any disclaimer, the term of this patent is extended or adjusted under 35 U.S.C. 154(b) by 282 days.

This patent is subject to a terminal disclaimer.

(21) Appl. No.: 15/171,045

(22) Filed: Jun. 2, 2016

(65) Prior Publication Data

US 2016/0355712 A1    Dec. 8, 2016

(30) Foreign Application Priority Data

Jun. 4, 2015    (DE) .................. 10 2015 210 345

(51) Int. Cl.
*C09J 163/00*    (2006.01)
*H01L 51/52*    (2006.01)
(Continued)

(52) U.S. Cl.
CPC ........... *C09J 163/00* (2013.01); *C09J 133/08* (2013.01); *H01L 51/5253* (2013.01);
(Continued)

(58) Field of Classification Search
None
See application file for complete search history.

(56) References Cited

U.S. PATENT DOCUMENTS

| 3,729,313 A | 4/1973 | Smith |
| 3,741,769 A | 6/1973 | Smith |

(Continued)

FOREIGN PATENT DOCUMENTS

| AU | 758128 B2 | 3/2003 |
| CN | 104011161 A | 8/2014 |

(Continued)

OTHER PUBLICATIONS

German Search Report dated Jan. 22, 2016.

(Continued)

*Primary Examiner* — Rachel Kahn
*Assistant Examiner* — Ha S Nguyen
(74) *Attorney, Agent, or Firm* — Norris McLaughlin, P.A.

(57) ABSTRACT

An adhesive having water vapor barrier properties, comprising an adhesive base comprised of
  at least one epoxy syrup
  at least one elastomer
  at least one initiator
  optionally at least one tackifier resin and
  optionally at least one further reactive resin and
optionally a solvent,
wherein the adhesive base without solvent has a water vapor permeation rate after activation of the reactive resin component of less than 100 g/m²d, preferably of less than 60 g/m²d, in particular less than 30 g/m²d, wherein the epoxy syrup comprises bisepoxy monomers and high molecular weight uncrosslinked polyepoxies produced therefrom, exhibits good barrier properties and is also sufficiently pressure sensitive to achieve easy handleability.

16 Claims, 5 Drawing Sheets

(51) Int. Cl.
- *C09J 133/08* (2006.01)
- *C08G 59/00* (2006.01)
- *C08G 59/22* (2006.01)
- *C08L 63/00* (2006.01)
- *C09J 7/38* (2018.01)
- *C09J 11/06* (2006.01)
- *C09J 11/08* (2006.01)
- *C09J 7/20* (2018.01)
- *C09J 4/00* (2006.01)
- *C09J 153/00* (2006.01)

(52) U.S. Cl.
CPC ............ *C08G 59/00* (2013.01); *C08G 59/22* (2013.01); *C08L 63/00* (2013.01)

(56) References Cited

U.S. PATENT DOCUMENTS

| | | | |
|---|---|---|---|
| 4,058,401 A | 11/1977 | Crivello | |
| 4,138,255 A | 2/1979 | Crivello | |
| 4,231,951 A | 11/1980 | Smith et al. | |
| 4,250,053 A | 2/1981 | Smith | |
| 4,256,828 A | 3/1981 | Smith | |
| 4,394,403 A | 7/1983 | Smith | |
| 5,242,715 A | 9/1993 | Schoen et al. | |
| 5,721,289 A * | 2/1998 | Karim | C08F 283/10 522/113 |
| 2010/0063221 A1 | 3/2010 | Manabe et al. | |
| 2014/0315016 A1 | 10/2014 | Dollase et al. | |
| 2015/0079389 A1 * | 3/2015 | Krawinkel | C09J 193/04 428/355 R |

FOREIGN PATENT DOCUMENTS

| | | | |
|---|---|---|---|
| CN | 104302725 A | 1/2015 | |
| DE | 102012206273 A1 * | 10/2013 | ............ C09J 193/04 |
| DE | 10 2014 208 111 A1 | 10/2015 | |
| EP | 0 542 716 B1 | 6/1997 | |
| JP | 11021532 A * | 1/1999 | |
| JP | H1121532 A | 1/1999 | |
| JP | 2003105109 A * | 4/2003 | |
| JP | 2003105109 A * | 4/2003 | |
| SG | 160949 B | 11/2012 | |
| WO | 2009/055666 A1 | 4/2009 | |

OTHER PUBLICATIONS

English Translation Taiwanese Office Action for corresponding application No. 105115421, dated Feb. 12, 2018.

Office Action for co-pending Chinese Application No. 201610391174.4 dated Feb. 27, 2020 (English Translation).

* cited by examiner

ADHESIVE HAVING WATER VAPOUR BARRIER PROPERTIES COMPRISING INCIPIENTLY POLYMERIZED EPOXY SYRUP

This application claims foreign priority benefit under 35 U.S.C. § 119 of German Patent Application No. 10 2015 210 345.5, filed Jun. 4, 2015.

The present invention relates to an adhesive having water vapour barrier properties, comprising an adhesive base composed of at least one epoxy syrup, at least one elastomer, at least one initiator, optionally at least one tackifier resin and optionally at least one further reactive resin and optionally a solvent, to an adhesive tape comprising this adhesive having water vapour barrier properties and to the use of such an adhesive or such an adhesive tape.

BACKGROUND OF THE INVENTION

Encapsulation of moisture-sensitive organic assemblies, for example organic light emitting diodes (OLEDs), is achieved using special barrier adhesives, also described as adhesives having water vapour barrier properties. A good adhesive for sealing (opto)electronic components has a low permeability to oxygen and in particular to water vapour, has sufficient adhesion on the assembly and can readily wet out said assembly. Low adhesion on the assembly reduces the barrier effect at the interface, thus enabling entry of oxygen and water vapour irrespective of the properties of the adhesive. Only when the contact between adhesive and substrate is uninterrupted are the adhesive properties the determining factor for the barrier action of the adhesive.

Barrier action is typically characterized by reporting the oxygen transmission rate (OTR) and the water vapour transmission rate (WVTR). The respective rates indicate the area- and time-specific flow of oxygen and water vapour through a film under specific conditions of temperature and partial pressure and possibly further measurement conditions such as relative air humidity. The smaller these values, the more suitable the respective material for encapsulation. The reported permeation is not based solely on the values of WVTR or OTR but always also includes an indication of the mean path length of the permeation, for example the thickness of the material, or normalization to a particular path length.

The prior art currently often employs liquid epoxy adhesives as adhesives having water vapour barrier properties, or barrier adhesives, for edge encapsulation. For full-area encapsulation, pressure-sensitive adhesives/tapes may be used. Polymers and tackifier resins are moreover added to the liquid epoxies so that the formulations become pressure-sensitive. Tests have shown that barrier performance increases with the proportion of epoxy resin.

Since barrier performance increases with the proportion of epoxy in the tape it is desirable to achieve high epoxy proportions. However, the problem is that the epoxy is liquid and thus the pressure-sensitive properties decrease and eventually even disappear with increasing epoxy proportion. Current barrier adhesives are therefore limited in their epoxy content. The viscosity of epichlorohydrin-based epoxy resins is typically adjusted via the ratio of epichlorohydrin to, for example, bisphenol-A and a resulting slight increase in molecular weight ["Epoxy Adhesive Formulations" 2006, E. M. Petrie, p. 30ff]. The disadvantage is a high halogen content resulting from the production process which is not tolerated in applications in the electronics industry. Although the epoxy may be purified by distillation (e.g. Epikote 828 LVEL), this only works with distillable (liquid) epoxies which in turn cannot be formulated into the tape in large proportions since it would otherwise be liquid. Another option is provided by so-called b-staged epoxy systems. These are epoxy systems which have already been subjected to mild incipient crosslinking and are thus no longer liquid. However, the big disadvantage of these systems is that they require refrigerated transport since otherwise the crosslinking reaction progresses and the epoxies undergo complete crosslinking.

More specialized epoxy monomers, for example epoxycyclohexyl derivatives, which are not produced via the epichlorohydrin route are often very liquid. One example thereof is Uvacure 1500.

There is therefore a need for epoxies which, while uncrosslinked, have a sufficiently high viscosity to be able to provide a barrier adhesive which, despite good water vapour barrier properties, exhibits high pressure-sensitivity. The epoxies having increased viscosity should moreover be obtained by a route other than the epichlorohydrin route.

AU 758128 B2 describes storage-stable cationically curing multifunctional epoxy mixtures. To achieve storage stability of the multifunctional epoxy resins it is necessary according to this document to avoid undesired premature polymerization. This is achieved by adding 0.0005 to 10 wt % of an organic and/or inorganic alkaline earth metal or alkali metal compound during the polymerization of multifunctional epoxy monomers. Polymerization before desired crosslinking is thus to be avoided in any event. In addition to the inventive stabilization of these adhesives it follows from this document that for cationically curable liquid adhesives epoxycyclohexyl derivates are particularly preferred so that it would be desirable to be able to produce high-viscosity epoxies from this monomer as well.

SG 160949 B proposes reacting diepoxies with diisocyanates. This mixture affords cyclic trimers (isocyanurates) and oxazolidinones having a $M_w$<3000 g/mol and a low polydispersity which can then be cured like epoxies. It is necessary to use at least difunctional substances since otherwise no reactive groups would be available for the subsequent curing. However, the compounds formed have low viscosities.

SUMMARY OF THE INVENTION

The present invention therefore has for its object the production of a storable, pressure-sensitive barrier adhesive having particularly high epoxy contents (>50%) coupled with very low halogen contents which can be used for encapsulating organic electronics.

The object is achieved by an adhesive having water vapour barrier properties of the type referred to at the outset where the adhesive base without solvent has a water vapour permeation rate after activation of the reactive resin component of less than 100 g/m²d, preferably of less than 60 g/m²d, in particular less than 30 g/m²d, wherein the epoxy syrup comprises bisepoxy monomers and high molecular weight uncrosslinked polyepoxies produced therefrom.

It has now been found that, surprisingly, this particular combination of bisepoxy monomers and high molecular weight uncrosslinked polyepoxies makes it possible to achieve a high viscosity of the barrier adhesive while maintaining good water vapour barrier properties. The thus produced adhesives having water vapour barrier properties are readily processable, are easy to handle and easy to apply due to their viscosity.

DETAILED DESCRIPTION

Figure 1:
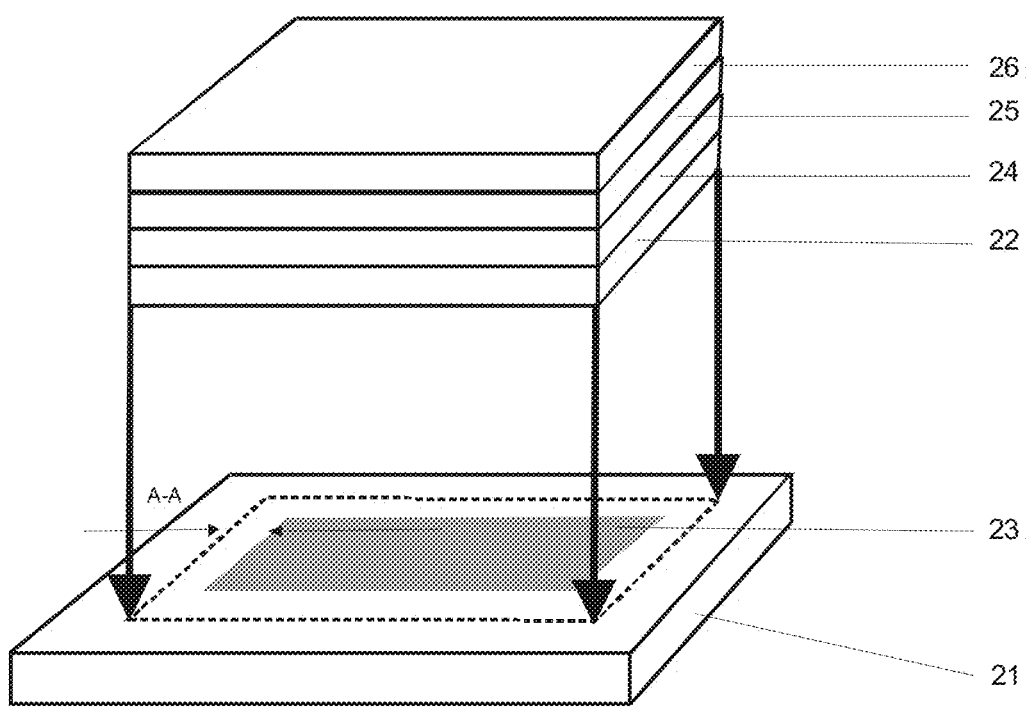
FIG. 1 illustrates a calcium test used as a measure for determining the lifetime of an electronic assembly.

"High molecular weight uncrosslinked polyepoxies" are polyepoxies where polymerization of the monomers to afford polymer chains has been effected but linking of a plurality of polymer chains to one another such that a network could have formed has (substantially) not yet been effected.

It is preferable when the viscosity of the resulting epoxy syrup is at least twice as high, preferably at least four times as high and in particular at least ten times as high as the viscosity of the employed epoxy in the unreacted state. Such a viscosity provides the epoxy syrup with a viscosity which allows the resulting adhesive having water vapour barrier properties to exhibit good pressure-sensitive properties.

All viscosities reported in this application relate, unless otherwise stated, to a measurement at 23° C. according to DIN 53019-1.

The term "epoxy syrup" describes epoxies having a viscosity of at least 1 Pa·s (corresponds to 1 000 mPs).

It is preferable when the epoxy syrup is present in the adhesive base in an amount from 10 to 80 wt %, particularly preferably from 20 to 75 wt %, in particular from 35 to 70 wt %. It is therefore possible to achieve proportions of epoxies in the adhesive far beyond what the prior art was able to achieve so that very good water vapour barrier properties are possible while retaining sufficient viscosity of the adhesive.

It is particularly preferable when the molecular weight distribution of the polyepoxies present in the epoxy syrup encompasses at least the range from 2000 g/mol to 300 000 g/mol. This means the epoxy syrup contains epoxy molecules having very different molecular weights, from very low to very high, all compounds from the low molecular weight (<2000 g/mol) right through to the high molecular weight (>300 000 g/mol) being present. Compounds having a lower or even higher molecular weight may also be present.

It is particularly advantageous when the epoxy syrup of the adhesive having water vapour barrier properties has a viscosity of at least 50 Pa s, preferably between 50-800 Pa s, particularly preferably between 75-500 Pa s and in particular between 100-350 Pa s.

However, the viscosity is not obtained as a result, for instance, of mixing different polymers but rather as a result of polymer molecules of very different sizes forming on account of the reaction conditions. Polydispersity D is a measure of the distribution of the molar masses. Polydispersity D is defined as the weight-average molecular weight $M_w$/the number-average molecular weight $M_n$ of the polymers present. A large polydispersity value thus means a broad molar mass distribution from very short-chain up to long-chain macromolecules, i.e. molecules of many different chain lengths are present in the polymer.

For the present invention this means that the mono-, bi- and multimodal molecular weight distribution is such that molecules of low molecular weight constituents (<2000 g/mol) right through to very high molecular weight constituents (>300 000 g/mol) may be found.

Polydispersities of the epoxy syrups of at least 3, preferably at least 5, are characteristic for such broad molecular weight distributions. However, in many cases the polydispersities are markedly higher. Depending on the reaction management of the incipient polymerization, polydispersities of up to 100 were achieved.

This special feature of the molecular weight distribution contributes in particular to the advantageous properties according to the invention of a high epoxy content (many low molecular weight bisepoxies) coupled with high-viscosity behaviour (very high molecular weight epoxies) of the product.

It is particularly advantageous when in the epoxy syrup of the adhesive having water vapour barrier properties in the uncrosslinked state at least 65%, preferably at least 75%, in particular at least 80%, of the original epoxy groups are still present, a large part of the epoxy units in the syrup thus still being present in the monomer form. It is thus particularly useful when in the epoxy syrup a large amount of the multifunctional epoxy monomers employed is still present in unreacted form as monomer and high molecular weight, but still uncrosslinked, polyepoxies have been formed only sporadically.

The term "uncrosslinked state" means that, while epoxy monomers have been polymerized to form chains, these chains have not reacted with one another to form a network structure. This is manifested in the epoxy syrups according to the invention being completely soluble in suitable solvents.

Particularly suitable multifunctional epoxies are bisepoxies. Once polymerization has been effected a further epoxy group is available which can later bring about crosslinking in the epoxy adhesive resin.

Multifunctional epoxies that have proven particularly advantageous include bisepoxycyclohexyl derivatives, in particular 3,4-epoxycyclohexylmethyl-3,4-epoxycyclohexane carboxylate, and bisepoxies based on bisphenol-A, bisphenol-S or bisphenol-F. These make it possible to produce syrups having a viscosity which is well-suited for further processing the epoxies to afford the desired pressure-sensitive adhesives having water vapour barrier properties.

It is moreover particularly advantageous when the epoxy syrup is obtained by incipiently polymerizing the bisepoxy monomers. This means that the epoxy monomers are not completely polymerized but rather the polymerization reaction is only commenced and then quickly brought to an end again. This incipiently polymerizes the epoxies such that high molecular weight polyepoxies are produced from, for example, bisepoxy monomers without these undergoing crosslinking. The thus obtained oxide syrups are ideally suited for producing epoxy adhesives having pressure-sensitive properties. It is important here that initiation is effected only after the initiator is thoroughly distributed in the epoxy. Otherwise the reactive centres are too close together and crosslinking occurs which is not yet desired at this stage. In order to achieve mixing the mixture may be stirred for example, but other forms of mixing are also conceivable and possible.

It is moreover advantageous when the polymerization of the bisepoxy monomers is stopped by addition of an initiator scavenger upon reaching a desired viscosity of epoxy syrup. This makes it possible to make the obtained epoxy syrups storage-stable for several months. Even at higher temperatures of 80° C. for example, the obtained epoxy syrups are storage-stable over several days. Particularly suitable initiator scavengers include a mixture of water and acetone, solutions of alkali metal/alkaline earth metal hydroxides or solutions of alkali metal/alkaline earth metal alkoxides. When a mixture of water and acetone is used a 1:1 ratio of the two components is particularly preferred.

The amount of initiator scavenger should preferably be equal/substantially equal to the amount of initiator. Thus, when 7 g of initiator are used it is advantageous to also use 7 g of initiator scavenger.

The process according to the invention performs particularly well when the initiator for the incipient polymerization is selected from the group consisting of photoinitiator and thermal initiator for initiating a cationic polymerization. In the case where a photoinitiator or a thermal initiator is used an amount of not more than 0.1 wt %, preferably not more than 0.08 wt %, in particular not more than 0.05 wt %, is particularly preferred. This allows the target viscosities to be achieved in a particularly simple and easy-to-handle fashion.

In addition to these classical initiators for cationic epoxy curing, specific isocyanates are surprisingly also particularly suitable as initiators for the present invention.

A particularly suitable initiator is an electron-poor monoisocyanate which is employed in an amount of not more than 10 wt %, preferably not more than 8 wt % and in particular not more than 7 wt %. The reaction is particularly easily controllable when the monoisocyanate is employed in an amount of 7±0.5 wt %. Suitable monoisocyanates are in particular selected from the group consisting of p-tolyl isocyanate, o-tolyl isocyanate and sulphonyl isocyanates, in particular p-toluenesulphonylmethyl isocyanate, o-toluenesulphonylmethyl isocyanate, 4-chlorbenzylsulphonyl isocyanate, o-toluenesulphonyl isocyanate, p-toluenesulphonyl isocyanate and benzylsulphonyl isocyanate, p-toluenesulphonyl isocyanate being particularly preferred.

A temperature range which has proven particularly advantageous for carrying out the incipient polymerization reaction to produce the epoxy syrup initiated with electron-poor isocyanates is the range between 20° C. and 120° C., preferably between 40° C. and 100° C., in particular between 80° C. and 90° C.

For thermal cationic initiators, temperatures which correspond to their initiation temperature or are slightly below said temperature are chosen.

There is a correlation between the temperature and the amount of initiator. The more initiator is added the lower the temperature required to achieve the same reaction rate. While, for example, in the case of the electron-poor isocyanates 10 wt % of initiator will bring about only a very slow rate at room temperature, at 85° C. an amount of 7 wt % of initiator is sufficient to carry out the reaction within just a few hours.

It was found that, surprisingly, the process for incipient polymerization described hereinabove results in a slow and controlled increase in viscosity during the polymerization. Although multifunctional, in particular difunctional, epoxies which very rapidly form insoluble highly crosslinked networks are concerned, the epoxy adhesive resins produced with this process remain surprisingly soluble. The explanation for this behaviour is that relatively few initiating species are formed by the initiator, for example the p-toluenesulphonylmethyl isocyanate, that the growing chains thus cannot meet and that consequently at very low epoxy conversions few very high molecular weight polymers are formed. The viscosity increase is thus attributable to the formation of very high molecular weight polyepoxies. GPC measurements and FT-IR spectra support this theory. It is important here that initiation is effected only after the initiator is thoroughly distributed in the epoxy so that no crosslinking is effected at this stage.

Particular preference is given to adhesives having water vapour barrier properties comprising viscous epoxy syrups where the epoxy monomer is 3,4-epoxycyclohexylmethyl-3,4-epoxycyclohexane carbon/late and the proportion of epoxy syrup is greater than 30%. For adhesives having water vapour barrier properties comprising high epoxy syrup proportions, syrups having a viscosity of at least 1 Pa s (1000 mPs), preferably 10 Pa s (10 000 mPs), in particular 25 Pa s (25 000 mPs), are particularly preferred since this affords pressure-sensitive adhesives that are easy to apply. For pressure-sensitive adhesives having particularly good barrier properties (high lag time) preference is given to epoxy syrups having viscosities of at least 50 Pa s, preferably between 50-800 Pa s, particularly preferably between 75-500 Pa s and in particular between 100-350 Pa s.

It is particularly suitable when the at least one epoxy syrup present in an adhesive having water vapour barrier properties according to the invention is obtainable by a process comprising the steps of:
  adding an initiator selected from the group consisting of electron-poor monoisocyanate, photoinitiator and thermal initiator to at least one liquid bisepoxy monomer;
  mixing the components;
  polymerizing the bisepoxy such that the viscosity of the resulting epoxy syrup is at least twice as high, preferably at least four times as high and in particular at least ten times as high as the viscosity of the employed epoxy in the unreacted state.

The present invention moreover relates to an adhesive tape comprising an adhesive having water vapour barrier properties according to the invention. Such adhesive tapes allow for particularly simple application.

One area of application for which the present epoxy syrups/the adhesive produced therefrom or the adhesive tape produced therefrom are exceptionally suitable is the encapsulation of assemblies in the field of organic electronics. However countless further applications requiring a pressure-sensitive epoxy resin adhesive having water vapour barrier properties are conceivable.

Initiators for the cationic polymerization of epoxies in the context of this invention include all thermal and photochemical initiators known to those skilled in the art. These are employed not only for producing the epoxy syrup but also in the adhesive tapes according to the invention.

Examples of photoinitiators include but are not limited to:
  sulphonium salts (see for example U.S. Pat. Nos. 4,231,951 A, 4,256,828 A, 4,058,401 A, 4,138,255 A and US 2010/063221 A1) such as triphenylsulphonium hexafluoroarsenate, triphenylsulphonium hexafluoroborate, triphenylsulphonium tetrafluoroborate, triphenylsulphonium tetrakis(pentafluorobenzyl)borate, methyldiphenylsulphonium tetrafluoroborate, methyldiphenylsulphonium tetrakis(pentafluorobenzyl)borate, dimethylphenylsulphonium hexafluorophosphate, triphenylsulphonium hexafluorophosphate, triphenylsulphonium hexafluoroantimonate, diphenylnaphthylsulphonium hexafluoroarsenate, tritolylsulphonium hexafluorophosphate, anisyldiphenylsulphonium hexafluoroantimonate, 4-butoxyphenyldiphenylsulphonium tetrafluoroborate, 4-butoxyphenyldiphenylsulphonium tetrakis(pentafluorobenzyl)borate, 4-chlorophenyldiphenylsulphonium hexafluoroantimonate, tris(4-phenoxyphenyl)sulphonium hexafluorophosphate, di(4-ethoxyphenyl)methylsulphonium hexafluoroarsenate, 4-acetylphenyldiphenylsulphonium tetrafluoroborate, 4-acetylphenyldiphenylsulphonium tetrakis(pentafluorobenzyl)borate, tris(4-thiomethoxyphenyl)sulphonium hexafluorophosphate, di(methoxysulphonylphenyl)methylsulphonium hexafluoroantimonate, di(methoxynaphthyhmethylsulphonium tetrafluoroborate, di(methoxynaphthyl)methylsulphonium tetrakis(pentafluorobenzyl)borate, di(carbomethoxyphenyl)methylsulphonium hexafluorophosphate, (4-octyloxyphenyl)diphenylsulphonium tetrakis(3,5-bistrifluoromethylphenyl)borate, tris[4-(4-acetylphenyl)thiophenyl]sulphonium tetrakis(pentafluorophenyl)borate, tris(dodecylphenyl)sulphonium tetrakis(3,5-bistrifluoromethylphenyl)borate, 4-acetamidophenyldiphenylsulphonium tetrafluoroborate, 4-acetamidophenyldiphenylsulphonium tetrakis(pentafluorobenzyl)borat, dimethylnaphthylsulphonium hexafluorophosphate, trifluoromethyldiphenylsulphonium tetrafluoroborate, trifluoromethyldiphenylsulphonium tetrakis(pentafluorobenzyl)borate, phenylmethylbenzylsulphonium hexafluorophosphate, 5-methylthianthrenium hexafluorophosphate, 10-phenyl-9,9-dimethylthioxanthenium hexafluorophosphate, 10-phenyl-9-oxothioxanthenium tetrafluoroborate, 10-phenyl-9-oxothioxanthenium tetrakis(pentafluorobenzyl)borate, 5-methyl-10-oxothianthrenium tetrafluoroborate, 5-methyl-10-oxothianthrenium tetrakis(pentafluorobenzyl)borate and 5-methyl-10,10-dioxothianthrenium hexafluorophosphate or p-toluenesulphonyl isocyanate or iodonium salts (see for example U.S. Pat. Nos. 3,729,313 A, 3,741,769 A, 4,250,053 A, 4,394,403 A and US 2010/063221 A1) such as diphenyliodonium tetrafluoroborate, di(4-methylphenyl)iodonium tetrafluoroborate, phenyl-4-methylphenyliodonium tetrafluoroborate, di(4-chlorophenyl)iodonium hexafluorophosphate, dinaphthyliodonium tetrafluoroborate, di(4-trifluoromethylphenyl)iodonium tetrafluoroborate, diphenyliodonium hexafluorophosphate, di(4-methylphenyl)iodonium hexafluorophosphate, diphenyliodonium hexafluoroarsenate, di(4-phenoxyphenyl)iodonium tetrafluoroborate, phenyl-2-thienyliodonium hexafluorophosphate, 3,5-dimethylpyrazolyl-4-phenyliodonium hexafluorophosphate, diphenyliodonium hexafluoroantimonate, 2,2'-diphenyliodonium tetrafluoroborate, di(2,4-dichlorophenyl)iodonium hexafluorophosphate, di(4-bromophenyl)iodonium hexafluorophosphate, di(4-methoxyphenyl)iodonium hexafluorophosphate, di(3-carboxyphenyl)iodonium hexafluorophosphate, di(3-methoxycarbonylphenyl)iodonium hexafluorophosphate, di(3-methoxysulphonylphenyl)iodonium hexafluorophosphate, di(4-acetamidophenyl)iodonium hexafluorophosphate, di(2-benzothienyl)iodonium hexafluorophosphate, diaryliodonium tristrifluoromethylsulphonylmethide such as diphenyliodonium hexafluoroantimonate, diaryliodonium tetrakis(pentafluorophenyl)borate such as diphenyliodonium tetrakis(pentafluorophenyl)borate, (4-n-desiloxyphenyl)phenyliodonium hexafluoroantimonate, [4-(2-hydroxy-n-tetradesiloxy)phenyl]phenyliodonium hexafluoroantimonate, [4-(2-hydroxy-n-tetradesiloxy)phenyl]phenyliodonium trifluorosulphonate, [4-(2-hydroxy-n-tetradesiloxy)phenyl]phenyliodonium hexafluorophosphate, [4-(2-hydroxy-n-tetradesiloxy)phenyl]phenyliodonium tetrakis(pentafluorophenyl)borate, bis(4-tert-butylphenyl)iodonium hexafluoroantimonate, bis(4-tert-butylphenyl)iodonium hexafluorophosphate, bis(4-tert-butylphenyl)iodonium trifluorosulphonate, bis(4-tert-butylphenyl)iodonium tetrafluoroborate, bis(dodecylphenyl)iodonium hexafluoroantimonate, bis(dodecylphenyl)iodonium tetrafluoroborate, bis(dodecylphenyl)iodonium hexafluorophosphate, bis(dodecylphenyl)iodonium trifluoromethylsulphonate, di(dodecylphenyl)iodonium hexafluoroantimonate, di(dodecylphenyl)iodonium triflate, diphenyliodonium bisulphate, 4,4'-dichlorodiphenyliodonium bisulphate, 4,4'-dibromodiphenyliodonium bisulphate, 3,3'-dinitrodiphenyliodonium bisulphate, 4,4'-dimethyldiphenyliodonium bisulphate, 4,4'-bissuccinimidodiphenyliodonium bisulphate, 3-nitrodiphenyliodonium bisulphate, 4,4'-dimethoxydiphenyliodonium bisulphate, bis(dodecylphenyl)iodonium tetrakis(pentafluorophenyl)borate, (4-octyloxyphenyl)phenyliodonium tetrakis(3,5-bistrifluoromethylphenyl)borate and (tolylcumyl)iodonium tetrakis(pentafluorophenyl)borate or ferrocenium salts (see for example EP 542 716 B1) such as $\eta_5$-(2,4-cyclopentadien-1-yl)-[(1,2,3,4,5,6,9)-(1-methylethyl)-benzene]iron.

Examples of commercialized photoinitiators include Cyracure UVI-6990, Cyracure UVI-6992, Cyracure UVI-6974 and Cyracure UVI-6976 from Union Carbide, Optomer SP-55, Optomer SP-150, Optomer SP-151, Optomer SP-170 and Optomer SP-172 from Adeka, San-Aid SI-45L, San-Aid SI-60L, San-Aid SI-80L, San-Aid SI-100L, San-Aid SI-110L, San-Aid SI-150L and San-Aid SI-180L from Sanshin Chemical, SarCat CD-1010, SarCat CD-1011 and SarCat CD-1012 from Sartomer, Degacure K185 from Degussa, Rhodorsil Photoinitiator 2074 from Rhodia, CI-2481, CI-2624, CI-2639, CI-2064, CI-2734, CI-2855, CI-2823 and CI-2758 from Nippon Soda, Omnicat 320, Omnicat 430, Omnicat 432, Omnicat 440, Omnicat 445, Omnicat 550, Omnicat 550 BL and Omnicat 650 from IGM Resins, Daicat II from Daicel, UVAC 1591 from Daicel-Cytec, FFC 509 from 3M, BBI-102, BBI-103, BBI-105, BBI-106, BBI-109, BBI-110, BBI-201, BBI-301, BI-105, DPI-105, DPI-106, DPI-109, DPI-201, DTS-102, DTS-103, DTS-105, NDS-103, NDS-105, NDS-155, NDS-159, NDS-165, TPS-102, TPS-103, TPS-105, TPS-106, TPS-109, TPS-1000, MDS-103, MDS-105, MDS-109, MDS-205, MPI-103, MPI-105, MPI-106, MPI-109, DS-100, DS-101, MBZ-101, MBZ-201, MBZ-301, NAI-100, NAI-101, NAI-105, NAI-106, NAI-109, NAI-1002, NAI-1003, NAI-1004, NB-101, NB-201, NDI-101, NDI-105, NDI-106, NDI-109, PAI-01, PAI-101, PAI-106, PAI-1001, PI-105, PI-106, PI-109, PYR-100, SI-101, SI-105, SI-106 and SI-109 from Midori Kagaku, Kayacure PCI-204, Kayacure PCI-205, Kayacure PCI-615, Kayacure PCI-625, Kayarad 220 and Kayarad 620, PCI-061T, PCI-062T, PCI-020T, PCI-022T from Nippon Kayaku, TS-01 and TS-91 from Sanwa Chemical, Deuteron UV 1240 from Deuteron, Tego Photocompound 1465N from Evonik, UV 9380 C-D1 from GE Bayer Silicones, FX 512 from Cytec, Silicolease UV Cata 211 from Bluestar Silicones and Irgacure 250, Irgacure 261, Irgacure 270, Irgacure PAG 103, Irgacure PAG 121, Irgacure PAG 203, Irgacure PAG 290, Irgacure CGI 725, Irgacure CGI 1380, Irgacure CGI 1907 and Irgacure GSID 26-1 from BASF.

Further systems likewise usable in accordance with the invention are known to those skilled in the art. Photoinitiators are used in uncombined form or as a combination of two or more photoinitiators.

Photoinitiators which exhibit absorption at less than 350 nm and advantageously at greater than 250 nm are advantageous. Initiators which absorb above 350 nm, for example in the range of violet light, are likewise employable. Particular preference is given to using sulphonium-based photoinitiators since they exhibit advantageous UV-absorption characteristics.

Thermal initiators for the cationic polymerization of epoxies

Examples of thermal initiators, so-called thermal acid generators (TAG), include benzylthiolanium salts with, for example, PF6, AsF6, or SBF6 anions described in U.S. Pat. No. 5,242,715 A, $BF_3$-amine complexes described in "Study of Polymerization Mechanism and Kinetics of DGEBA with $BF_3$-amine Complexes Using FT-IR and Dynamic DSC" (Ghaemy et al., Iranian Polymer Journal, Vol. 6, No. 1, 1997), lanthanid triflates described in "Study of Lanthanide Triflates as New Curing Initiators for Cycloaliphatic Epoxy Resins" (C. Mas et al., Macromolecular Chemistry and Physics, 2001, 202, No. 12) or blocked superacids such as, for example, ammonium triflate; ammonium perfluorobutanesulphonate (PFBuS); ammonium Ad-TFBS [4-adamantanecarboxyl-1,1,2,2-tetrafluorobutanesulphonate]; ammonium AdOH-TFBS [3-hydroxy-4-adamantanecarboxyl-1,1,2,2-tetrafluorobutanesulphonate]; ammonium Ad-DFMS [adamantanylmethoxycarbonyldifluoromethanesulphonate]; ammonium AdOH-DFMS [3-hydroxyadamantanyl-methoxycarbonyldifluoromethanesulphonate]; ammonium DHC-TFBSS [4-dehydrocholate-1,1,2,2-tetrafluorobutanesulphonate]; and ammonium ODOT-DFMS [hexahydro-4,7-epoxyisobenzofuran-1(3H)-one, 6-(2,2'-difluoro-2-sulphonatoacetic acid ester)].

Such systems are commercially available for example from King industries under the names TAG-2678, TAG-2713 or TAG-2172. At high temperatures these blocked acids liberate, for example, trifluoromethanesulphonic acid, p-toluenesulphonic acid or dodecylbenzylsulphonic acid which initiate cationic curing of epoxies.

In addition to the thermal and photochemical initiators, particularly preferred initiators for the polymerization reaction for producing the epoxy syrups include, as previously intimated, electron-poor monoisocyanates, for example p-tolyl isocyanate, p-toluenesulphonylmethyl isocyanate, o-tolyl isocyanate or o-toluenesulphonylmethyl isocyanate. Particular preference is given to derivatives of sulphonyl isocyanates (R—$SO_2$—NCO, R—$SO_2$—$CH_2$—NCO), for example 4-chlorobenzylsulphonyl isocyanate, o-toluenesulphonyl isocyanate, p-toluenesulphonyl isocyanate, benzylsulphonyl isocyanate.

EXAMPLES

Methods of Measurement

Viscosity Measurement:

Dynamic viscosity is a measure for the flowability of the fluid coating material. Dynamic viscosity may be determined according to DIN 53019. A viscosity of less than $10^8$ Pa·s is described as a fluid. Viscosity is measured in a cylindrical rotational viscometer with a standard geometry according to DIN 53019-1 at a measurement temperature of 23° C. and a shear rate of 1 $s^{-1}$.

Molecular Weight Distribution:

The molecular weight determinations for the number-average molecular weights $M_n$ and the weight-average molecular weights $M_w$ were effected by means of gel permeation chromatography (GPC). The eluent employed was THF (tetrahydrofuran) comprising 0.1 vol % of trifluoroacetic acid. The measurement was effected at 25° C. A PSS-SDV 10μ, ID 8.0 mm×50 mm precolumn was employed. PSS-SDV 10μ ID 8.0 mm×300 mm columns were used for separation. The sample concentration was 1.5 g/l and the flow rate was 0.5 ml per minute. Measurements were performed against poly(methyl methacrylate) standards.

The values reported in this document for the number-average molar mass $M_n$, the weight-average molar mass $M_w$ and the polydispersity relate to the determination by gel permeation chromatography (GPC)/the evaluation of such measurements.

Permeation Measurement (WVTR):

The WVTR is measured at 38° C. and 90% relative humidity according to ASTM F-1249. In each case the determination is carried out in duplicate and the average value calculated. The reported value is normalized to a thickness of 50 μm.

For the measurements, the adhesive transfer tapes were bonded to a high-permeability polysulphone membrane (available from Sartorius) which itself does not provide any contribution to the permeation barrier.

Adhesive Strength:

The adhesive strengths on glass were determined according to ISO 29862 (method 3) at 23° C. and 50% relative humidity at a peel rate of 30 mm/min or 3 mm/min and a peel angle of 180°. An etched PET film of 50 μm in thickness such as is obtainable from Coveme (Italy) was used as reinforcing film. The bonding of the measuring strip was undertaken using a rolling machine at a temperature of 23° C. The adhesive tapes were peeled off immediately after application. The measured value (in N/cm) was obtained as the average value from three individual measurements.

Lifetime Test:

A calcium test was used as a measure for determining the lifetime of an electronic assembly. Said calcium test is shown in FIG. 1. In this test a thin calcium layer 23 having dimensions of 10×10 $mm^2$ is deposited on a glass plate 21 under reduced pressure and then stored under a nitrogen atmosphere. The thickness of the calcium layer 23 is about 100 nm. The encapsulation of the calcium layer 23 is achieved using an adhesive tape (23×23 $mm^2$) comprising the adhesive under test 22 and a thin glass sheet 24 (30 μm, Schott) as carrier material. For stabilization, the thin glass sheet was laminated with a 100-μm-thick PET film 26 using a 50-μm-thick adhesive transfer tape 25 comprising a pressure-sensitive acrylate adhesive of high optical transparency. The adhesive 22 is applied to the glass plate 21 such that the adhesive 22 covers the calcium mirror 23 with an edge of 6.5 mm (A-A) overhanging on all sides. The impervious glass carrier 24 ensures that only the permeation through the pressure-sensitive adhesive or along the interfaces is determined.

The test is based on the reaction of calcium with water vapour and oxygen as is described for example by A. G. Erlat et al. in "47th Annual Technical Conference Proceedings—Society of Vacuum Coaters", 2004, pages 654 to 659, and by M. E. Gross et al. in "46th Annual Technical Conference Proceedings—Society of Vacuum Coaters", 2003, pages 89 to 92. This involves monitoring the light transmission of the calcium layer, which increases as a result of the conversion to calcium hydroxide and calcium oxide. In the test setup described, said conversion is effected starting from the edge so that the visible area of the calcium mirror decreases. The time until halving of the light absorption of the calcium mirror is referred to as lifetime and the time until onset of a steady decrease in the absorption is referred to as breakthrough time or lag time. The method captures not only the degradation of the surface of the calcium mirror starting from the edge and through punctuate degradation in the surface but also the homogeneous reduction in the layer thickness of the calcium mirror resulting from all-over degradation.

The chosen measurement conditions were 85° C. and 85% relative humidity. The specimens were all-over bonded in bubble-free fashion with a layer thickness of the pressure-sensitive adhesive of 50 µm. The measurements were undertaken on crosslinked adhesive tapes. The measured value (in h) was obtained as the average value from three individual measurements.

The time until complete degradation of the calcium mirror was further used to calculate a water vapour permeation rate (Ca-WVTR). The mass of vapour-deposited calcium was thus multiplied by a factor of 0.9 ($H_2O$/Ca mass ratio for the conversion reaction of metallic calcium to transparent calcium hydroxide) to determine the mass of permeated water vapour. This is expressed in terms of the permeation cross section (circumference of the test assembly×adhesive thickness) and the time until complete degradation of the calcium mirror. The calculated measured value is further divided by the width of the edge overhanging on all sides (in mm) and thus normalized to a permeation sector of 1 mm. The Ca-WVTR is reported in $g/m^2 \ast d$.

Materials Employed:

| | |
|---|---|
| Uvacure 1500 | cycloaliphatic diepoxy from Cytec ((3,4-epoxycyclohexane) methyl 3,4-epoxycyclohexylcarboxylate) |
| polyacrylate | acrylate copolymer of 2-hydroxyethyl acrylate, 2-ethylhexyl acrylate and C-17-acrylate, $M_n$ = 884000 g/mol |
| Uvacure syrup | see below for detailed production instructions |
| Escorez 5300 | a fully hydrogenated hydrocarbon resin from Exxon (Ring and Ball 105° C., DACP = 71, MMAP = 72) |
| Sibstar 62M | SiBS (polystyrene-block-polyisobutylene block copolymer) from Kaneka having a 20 wt % block polystyrene content. Also contains a proportion of diblock copolymers. |
| p-toluenesulphonyl isocyanate | electron-poor monoisocyanate |
| triarylsulphonium hexafluoroantimonate | cationic photoinitiator from Sigma-Aldrich The photoinitiator has an absorption maximum in the range from 320 nm to 360 nm and was provided as a 50 wt % solution in propylene carbonate |

The polyacrylate was produced according to the following protocol:

A 2 L glass reactor as conventionally used for radical polymerizations was charged with 40 g of 2-hydroxyethyl acrylate, 240 g of 2-ethylhexyl acrylate, 120 g of C17-acrylate (three-fold branched chains with C3-C4 chain segments, BASF SE), 133 g of 69/95 special boiling point spirit and 133 g of acetone. After nitrogen gas had been passed through the reaction solution with stirring for 45 minutes, the reactor was heated to 58° C. and 0.2 g of Vazo 67 (DuPont) was added. Subsequently, the external heating bath was heated to 75° C. and the reaction was conducted constantly at this external temperature. After 1 h of reaction time, 50 g of toluene were added. After 2.5 h the mixture was diluted with 100 g of acetone. After 4 h of reaction time, a further 0.2 g of Vazo 67 were added. After 7 h of polymerization time the mixture was diluted with 100 g of 60/95 special boiling point spirit and 22 h with 100 g of acetone. After 24 h of reaction time, the polymerization was stopped and the reaction vessel was cooled to room temperature. The molecular weight $M_n$ was 884 000 g/mol.

Production of the Uvacure Syrups:

Initiation with Electron-Poor Monoisocyanates:

In a 2 l polymerization reactor 1 kg of Uvacure 1500 were heated to 85° C. both under a nitrogen atmosphere and also without protective gas. The Uvacure 1500 has a viscosity of 0.25 Pa s. The initiator was added in countercurrent with nitrogen and the solution was stirred slowly.

To enable determination of the molecular weight distributions and viscosities, samples were taken at different reaction times during the reaction and analysed by means of GPC and viscometry.

TABLE 1

GPC results of inventive epoxy syrups initiated with electron-poor monoisocyanate

| amount of TSI [%] | Mw [g mol$^{-1}$] | Mn [g mol$^{-1}$] | D | reaction time [h] | temperature [° C.] |
|---|---|---|---|---|---|
| 6 | 13500 | 780 | 17.4 | 3.25 | 100 |
| 6 | 11100 | 740 | 15.1 | 4.25 | 100 |
| 6 | 22000 | 790 | 27.9 | 5.25 | 100 |
| 7 | 22500 | 830 | 27.3 | 1.0 | 100 |
| 7 | 59700 | 830 | 71.7 | 2.25 | 100 |
| 7 | 78400 | 850 | 92 | 3.75 | 100 |
| 7.4 | 5100 | 630 | 8 | 0.5 | 100 |
| 7.4 | 6000 | 600 | 9.9 | 1 | 100 |
| 7.4 | 16100 | 650 | 24.8 | 3.3 | 100 |

It is apparent that polydispersity increases with increasing reaction time.

TABLE 2

Viscosities of inventive epoxy syrups initiated with TSI

| amount of TSI [%] | reaction time [min] | viscosity [Pa s] |
|---|---|---|
| 6 | 30 | 10.9 |
| 6 | 60 | 40 |
| 6 | 90 | 67.2 |
| 6 | 130 | 132 |
| 6 | 180 | 203 |
| 6 | 230 | 334 |
| 7 | 30 | 39.6 |
| 7 | 60 | 115 |
| 7 | 90 | 230 |
| 7 | 120 | 420 |
| 7 | 190 | 1536 |
| 7 | 210 | 1956 |

It is readily apparent also from table 2 that a greater amount of initiator causes the reaction to proceed markedly more rapidly and that a viscosity increase is achieved very much more rapidly.

Figure 2:
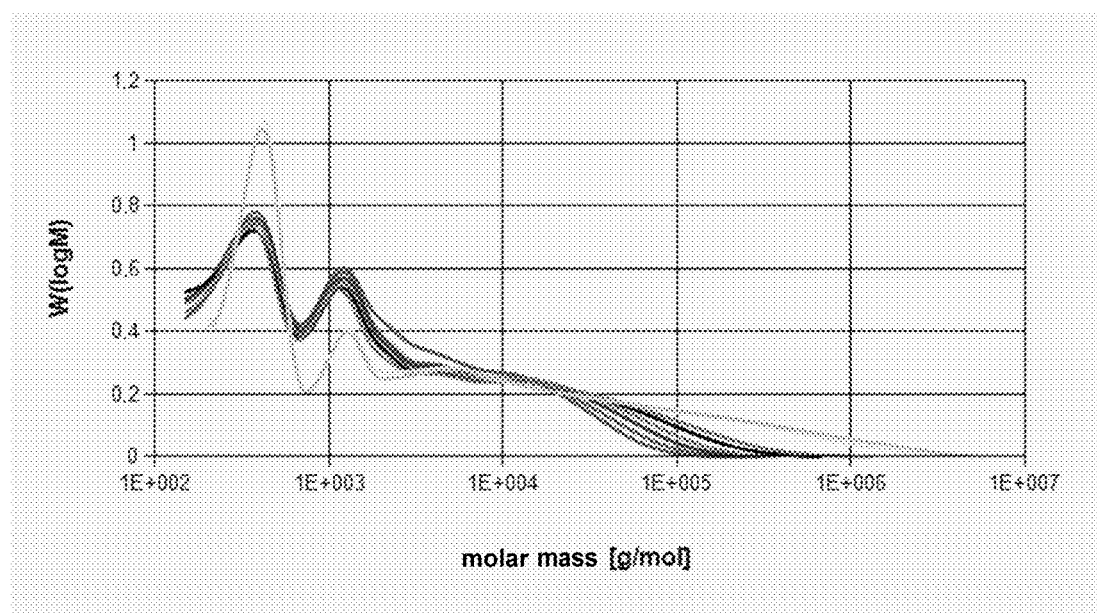
FIG. 2 shows the molecular weight distribution of Uvacure syrups polymerized over time periods of different durations.

FIG. 2 shows the molecular weight distribution of Uvacure syrups polymerized over time periods of different durations. What is striking is the enormously broad distribution containing many molecules smaller than 1000 g/mol but also chains of in some cases up to greater than $10^6$ g/mol which bring about the high viscosity.

Initiation with Highly-Dilute Photoinitiators

In a 2 l glass reactor a photoinitiator (triarylsulphonium hexafluoroantimonate) was added to 1 kg of Epon Resin 828 under exclusion of light and under a nitrogen atmosphere at 23° C. with stirring (50 rpm). Initiation of the reaction was effected by 2-minute irradiation with 4 medium pressure Hg lamps positioned radially around the polymerization reactor.

To enable determination of the viscosities, samples were taken at different reaction times during the reaction and analysed by means of GPC and viscometry.

TABLE 3

Viscosities of inventive epoxy syrups initiated with triarylsulphonium hexafluoroantimonate.

| amount of photoinitiator [%] | viscosity after 120 h [mPa s] |
|---|---|
| 0.004 | 500 |
| 0.01 | 860 |
| 0.02 | 1300 |

It is apparent that markedly smaller amounts of initiator are required and that for a given reaction time viscosities increase with increasing amount of initiator.

TABLE 4

Uvacure syrups used for adhesive formulations

| name | viscosity/Pa s |
|---|---|
| Uvacure syrup 1 | 21 |
| Uvacure syrup 2 | 60 |
| Uvacure syrup 3 | 203 |
| Uvacure syrup 4 | 392 |
| Uvacure syrup 5 | 1544 |
| Uvacure syrup 6 | 3016 |

To produce adhesive layers different adhesives were applied from a solution onto a conventional liner (siliconized polyester film) by means of a laboratory spreader and dried. The adhesive layer thickness after drying was 50±5 µm. In each case drying was effected initially at room temperature for 10 minutes and at 120° C. in a laboratory drying cabinet for 10 minutes. Immediately after drying the dried adhesive layers were each laminated on their exposed side with a second liner (siliconized polyester film with lower peel strength).

The samples were loaded into a glovebox. Some of the specimens were laminated in bubble-free fashion with a rubber roller onto a glass substrate vapour-deposited with Ca. The second PET liner was then removed and a ply of a thin glass was laminated on. This was followed by irradiation through the cover glass using UV light (dose: 80 mJ/cm$^2$; lamp type: undoped mercury source). This sample was used for the lifetime test.

The exact composition of the individual examples K1 to K10, V1 and K1 base and V1 base is reported in table 5.

TABLE 5 composition of the examples

| | example: | | | | | | | |
|---|---|---|---|---|---|---|---|---|
| | K1-6 wt fraction | K7 wt fraction | K8 wt fraction | K9 wt fraction | K10 wt fraction | V1 wt fraction | K1 base wt fraction | V1 base wt fraction |
| Sibstar 62M | 20 | 37.5 | 25 | 17.5 | 10 | — | 50 | |
| Uvacure 1500 | 0 | 0 | 0 | 0 | 0 | — | — | |
| Uvacure syrup 1-6 | 60 | 0 | 0 | 0 | 0 | — | 0 | |
| Uvacure syrup 5 | | 25 | 50 | 65 | 80 | 50 | | |
| polyacrylate | | | | | | 50 | 50 | 100 |
| Escorez 5300 | 20 | 37.5 | 25 | 17.5 | 10 | — | 50 | |
| triarylsulphonium hexafluoroantimonate | 0.1 | 0.1 | 0.1 | 0.1 | 0.1 | 0.1 | | |

Adhesive Compositions

A polystyrene-block-polyisobutylene block copolymer from Kaneka was chosen as the copolymer. The proportion of styrene in the overall polymer was 20 wt %. Sibstar 62M was used. The molar mass $M_w$ was 60 000 g/mol. The glass transition temperature of the polystyrene blocks was 100° C. and that of the polyisobutylene blocks was −60° C. The tackifier resin used was Escorez 5300 (Ring and Ball 105° C., DACP=71, MMAP=72) from Exxon, a fully hydrogenated hydrocarbon resin. Different Uvacure syrups were chosen as the reactive resin. These raw materials were dissolved in a mixture of toluene (300 g), acetone (150 g) and 60/95 special boiling point spirit (550 g) to form a 50 wt % solution.

A photoinitiator was then added to the solution. The photoinitiator was provided as a 50 wt % solution in propylene carbonate. The photoinitiator has an absorption maximum in the range of 320 nm to 360 nm.

The examples K1 to K6 are the adhesives using the Uvacure syrups 1 to 6 listed in table 4, i.e. adhesives comprising the same proportions of the individual compounds and differing only in the viscosity of the Uvacure syrup are concerned. Examples K7 to K10 use Uvacure syrup 5 from table 4 in different weight fractions. V1 (adhesive comprising 50 wt % acrylate) and K1 base (block copolymer comprising tackifier resin without epoxy syrup) and V1 base (pure acrylate) are comparative examples.

Figure 3:
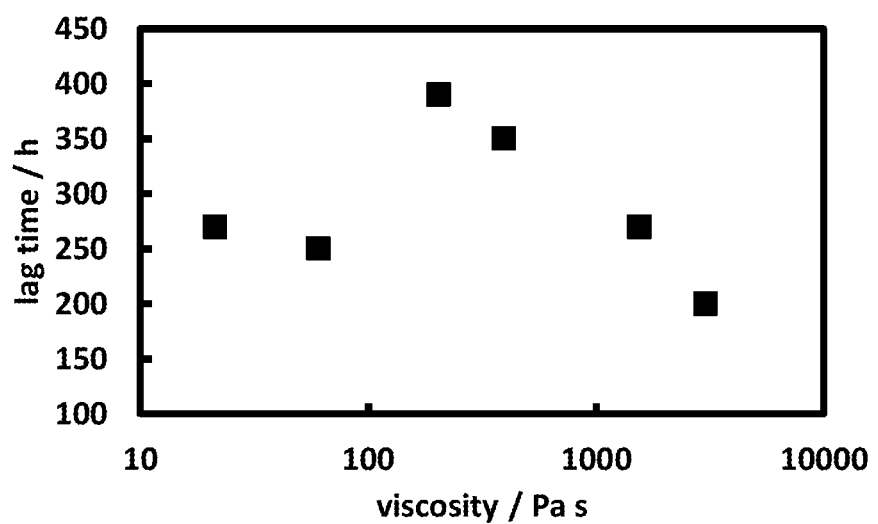
FIG. 3 shows the breakthrough time or lag time for the adhesives as a function of the viscosity of the Uvacure syrups employed.

FIG. 3 shows the breakthrough time or lag time for the adhesives K1-K6 (proportion of the epoxy syrup of 60 wt %) as a function of the viscosity of the Uvacure syrups employed. It is apparent that particularly preferred viscosities of the epoxy syrups employed are in the range of 100-1000 Pa s.

Figure 4:
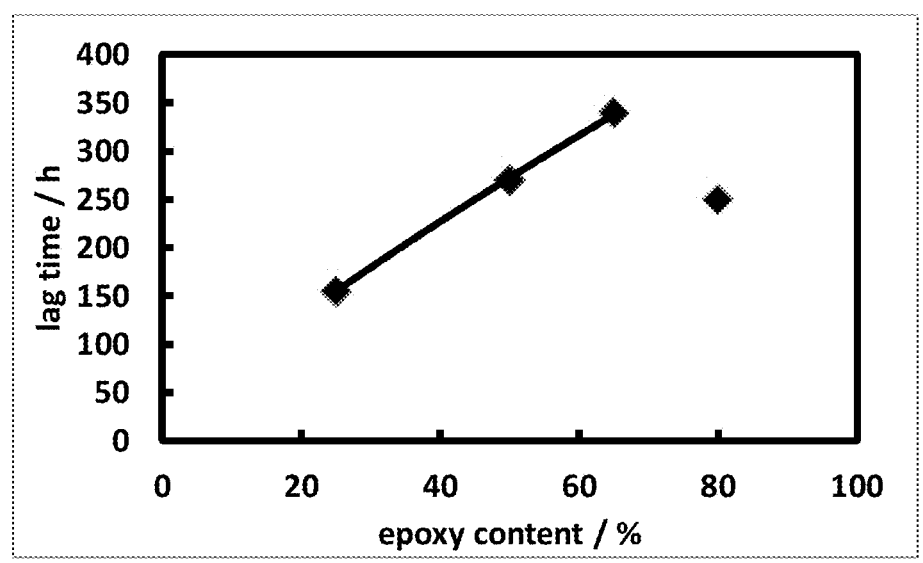
FIG. 4 shows the lag time results of storage tests at 85° C./85% RH (relative humidity) as a function of the amount of epoxy.

FIG. 4 shows the lag time results of storage tests at 85° C./85% RH (relative humidity) as a function of the amount of epoxy (K7-K10). It is apparent that the breakthrough time initially increases with increasing epoxy content and has a maximum between 60 wt % and 80 wt % epoxy content. At an even higher epoxy content of 80 wt % the breakthrough time falls again presumably because, as shown in FIG. 5, the adhesive strength declines markedly and water thus permeates along the interface.

Figure 5:
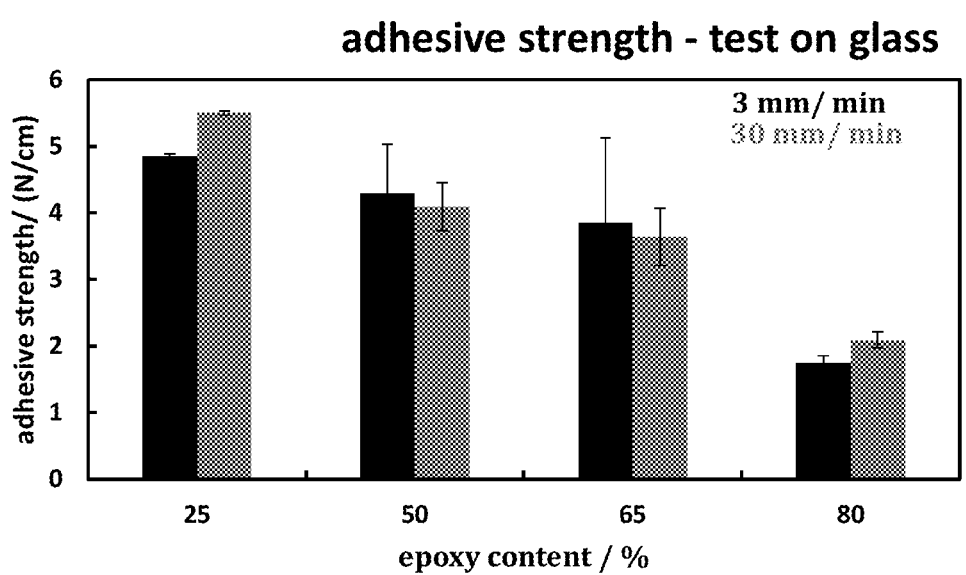
FIG. 5 illustrates the adhesive strength measurements for adhesives on glass with different epoxy contents.

FIG. 5 illustrates the adhesive strength measurements for adhesives on glass with different epoxy contents (K7-K10). It is apparent from the figure that the adhesive strength properties fall continuously with increasing epoxy proportion. It follows therefrom and from the results of the barrier properties that particularly well-balanced barrier adhesives comprise 50-75% epoxy syrup.

Finally, table 6 compares the breakthrough times as a function of the WVTR values for various adhesives.

TABLE 6

| lag time as a function of WVTR | | | | |
|---|---|---|---|---|
| | K1 base | V1 base | K8 | V1 |
| WVTR/g m$^{-2}$d$^{-1}$ | 7 | 673 | 17 | 239 |
| Lag time (85° C./85% RH)/h | 8 | 0 | 270 | 10 |

It is apparent from the table that, apart from V1, the adhesives have very low WVTR values. When these results are compared with the target barrier properties it is apparent that only the inventive adhesive exhibits a good lag time of less than 100 g/m$^2$d (K8).

The invention claimed is:

1. Adhesive comprising an adhesive base comprising:
   at least one epoxy syrup as a reactive resin comprising:
      at least one bisepoxy monomer;
      at least one initiator;
      an initiator scavenger controlling a termination of an incipient polymerization of the at least one bisepoxy monomer at a desired viscosity; and
      at least one high molecular weight uncrosslinked polyepoxy formed from the at least one bisepoxy monomer by the incipient polymerization;
   at least one elastomer;
   optionally at least one tackifier resin; and
   optionally a solvent,
   wherein the adhesive base has a water vapor permeation rate of less than 100 g/m$^2$d after activation of the reactive resin.

2. Adhesive according to claim 1, wherein the at least one epoxy syrup has a viscosity at least twice as high as a viscosity of the at least one bisepoxy monomer.

3. Adhesive according to claim 1, wherein the at least one epoxy syrup is present in an amount of from 10 to 80 wt % based on the total weight of the adhesive base.

4. Adhesive according to claim 1, wherein the at least one epoxy syrup has a molecular weight of from 2,000 to at least 100,000 g/mol.

5. Adhesive according to claim 1, wherein the at least one bisepoxy monomer comprises at least one bisepoxycyclohexyl derivative or at least one epoxy based on bisphenol-A, bisphenol-S, or bisphenol-F.

6. Adhesive according to claim 1, wherein the at least one bisepoxy monomer comprises at least one bisepoxycyclohexyl derivative.

7. Adhesive according to claim 6, wherein the at least one epoxy syrup has a viscosity of at least 50 Pa s.

8. Adhesive according to claim 1, wherein the at least one initiator comprises an initiator selected from the group consisting of an electron-poor monoisocyanate, a photoinitiator, and a thermal initiator.

9. Adhesive according to claim 8, wherein the initiator consists of an electron-poor monoisocyanate selected from the group consisting of p-tolyl isocyanate, o-tolyl isocyanate, and a sulphonyl isocyanate.

10. Adhesive according to claim 1, wherein the initiator scavenger comprises a mixture comprising water and acetone, a solution comprising at least one of an alkali metal hydroxide and an alkaline earth metal hydroxide, or a solution comprising at least one of an alkali metal alkoxide and an alkaline earth metal alkoxide.

11. Adhesive according to claim 1, wherein the at least one epoxy syrup is obtained by a process comprising:
   adding to at least one liquid bisepoxy monomer an initiator comprising an initiator selected from the group consisting of an electron-poor monoisocyanate, a photoinitiator, and a thermal initiator;
   mixing the initiator and the at least one liquid bisepoxy monomer to form a mixture;
   polymerizing the at least one liquid bisepoxy monomer in the mixture to form the at least one epoxy syrup,
   wherein the at least one epoxy syrup has a viscosity at least twice as high as a viscosity of the at least one liquid bisepoxy monomer before polymerization.

12. Adhesive tape comprising an adhesive according to claim 1.

13. A method comprising encapsulating an assembly with the adhesive of claim 1.

14. Adhesive according to claim 1, wherein the at least one epoxy syrup has a viscosity in the range of 100 to 1,000 Pa s.

15. Adhesive according to claim 3, wherein the at least one epoxy syrup is present in an amount from 20 to 75 wt. % based on the total weight of the adhesive base.

16. Adhesive according to claim 1, wherein the at least one epoxy syrup has a polydispersity of at least 3.

* * * * *